United States Patent [19]
Hirler et al.

[11] Patent Number: 6,147,381
[45] Date of Patent: Nov. 14, 2000

[54] FIELD EFFECT-CONTROLLABLE SEMICONDUCTOR COMPONENT

[75] Inventors: Franz Hirler, Isen; Frank Pfirsch; Wolfgang Werner, both of München, all of Germany

[73] Assignee: Infineon Technologies AG, Munich, Germany

[21] Appl. No.: 09/187,501

[22] Filed: Nov. 6, 1998

Related U.S. Application Data

[63] Continuation of application No. PCT/DE98/00244, Jan. 27, 1998.

[30] Foreign Application Priority Data

Feb. 25, 1997 [DE] Germany ............... 197 07 513

[51] Int. Cl.⁷ ................................................. H01L 29/72
[52] U.S. Cl. ........................ 257/328; 257/341; 257/378
[58] Field of Search ............................ 257/328, 341, 257/378

[56] References Cited

U.S. PATENT DOCUMENTS 4,364,073  12/1982  Becke et al. .
4,821,095  4/1989  Temple ..................... 257/328

FOREIGN PATENT DOCUMENTS

0615292A1  9/1994  European Pat. Off. .
0732749A2  9/1996  European Pat. Off. .
0735591A1  10/1996  European Pat. Off. .
4309764A1  9/1994  Germany .
07078978  3/1995  Japan .

*Primary Examiner*—Edward Wojciechowicz
*Attorney, Agent, or Firm*—Herbert L. Lerner; Laurence A. Greenberg; Werner H. Stemer

[57] ABSTRACT

A field effect-controllable semiconductor component, such as a new IGBT using planar technology, includes a shielding zone disposed about a base zone, resulting in elevation of a minority charge carrier density at a cathode side of the IGBT, leading to a reduction of forward voltage. The effect of a drift field produced due to a concentration gradient between the shielding zone and the base zone is that the inner zone no longer acts as a sink for the minority charge carriers. In order to ensure that the breakdown voltage of the IGBT is not reduced by the incorporation of the shielding zone, a non-connected, floating region of high conductivity is disposed in the region of the inner zone. A lower edge of the non-connected, floating region is deeper in the inner zone than a lower edge of the shielding zone. The non-connected, floating region has a conduction type opposite that of the shielding zone and the inner zone.

6 Claims, 2 Drawing Sheets

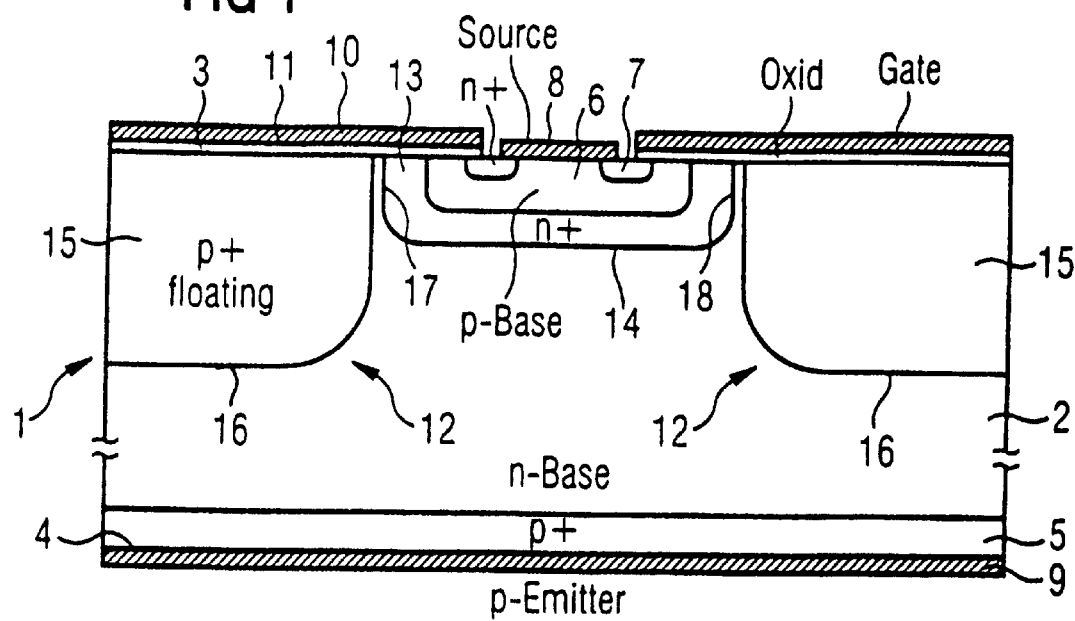
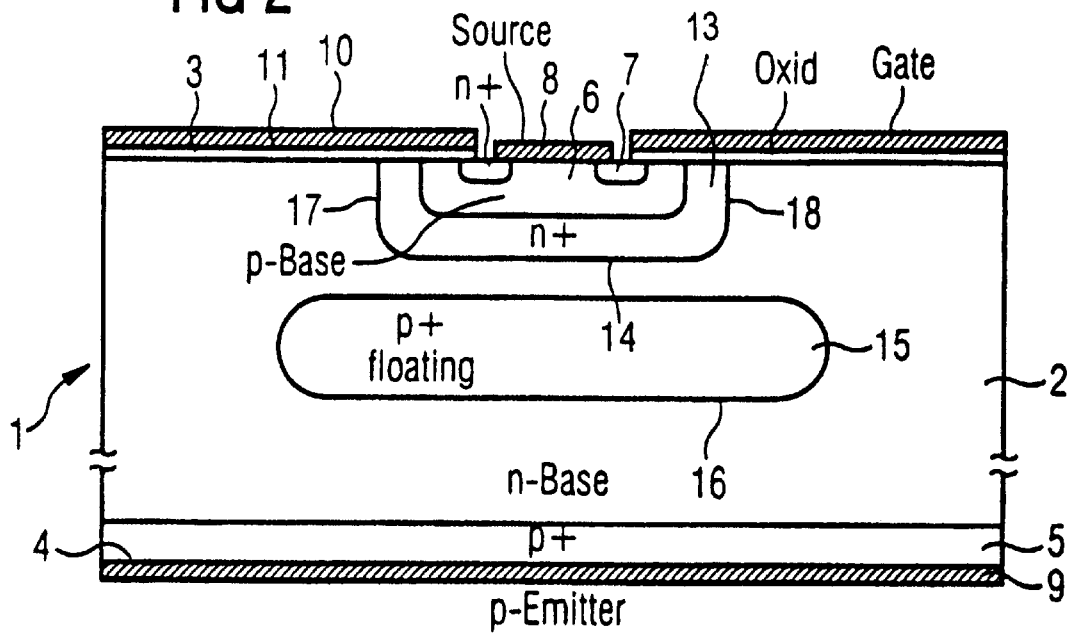

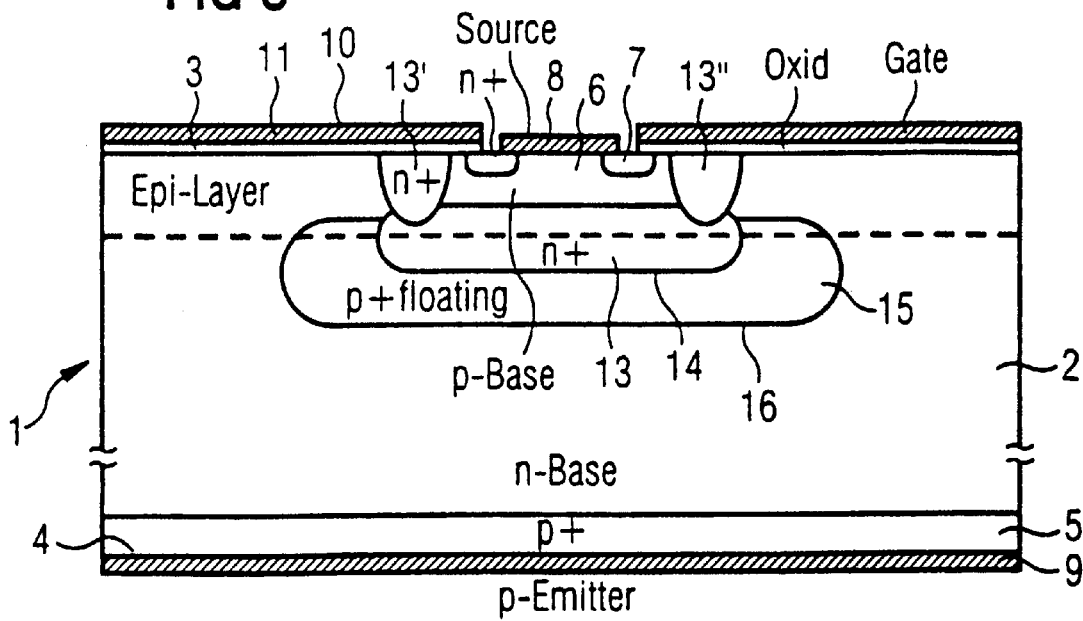

FIELD EFFECT-CONTROLLABLE SEMICONDUCTOR COMPONENT

CROSS-REFERENCE TO RELATED APPLICATION

This application is a continuation of copending International Application PCT/DE98/00244, filed Jan. 27, 1998, which designated the United States.

BACKGROUND OF THE INVENTION

Field of the Invention

The invention relates to a field-effect-controllable semiconductor component including a semiconductor body having an inner zone of a first conduction type which adjoins an upper surface of the semiconductor body, an anode zone of a second conduction type which adjoins a lower surface of the semiconductor body, at least one base zone of the second conduction type which is embedded in the upper surface of the semiconductor body, at least one emitter zone of the first conduction type which is embedded in the base zone, an emitter electrode which is disposed above the upper surface of the semiconductor body and is conductively connected to the emitter zone, a collector electrode which is disposed below the lower surface of the semiconductor body and is conductively connected to the anode zone, and a gate electrode which is disposed above the upper surface of the semiconductor body and covers parts of the base zone and of the emitter zone, with an insulating clearance.

A semiconductor component of the above-mentioned type has been disclosed in the form of an IGBT (Insulated Gate Bipolar Transistor) and thoroughly described in U.S. Pat. No. 4,364,073, for example. All known IGBTs are constructed essentially similarly, irrespective of the fabrication technology, and exhibit similar electrical behavior. In a forward mode, high reverse voltages can be blocked and large powers can be switched. In a reverse mode, the IGBTs exhibit a clear-cut diode characteristic on which a transistor characteristic (that can be influenced by the gate voltage) can be superposed. The load current path of an IGBT contains a diode in the forward direction. If the MOS transistor switches on, then a majority charge carrier current flows through the MOS channel through the base zone and through the pn junction to the collector zone. The consequence thereof is that minority charge carriers are injected into the inner zone. Some of the minority charge carriers flow directly through the base zone to the emitter electrode. That portion of the minority charge carrier current generates a voltage drop in the base zone.

Since the base zone acts as a sink for the minority carriers, in the planar IGBTs mentioned in the introduction it has not been possible to distinctly reduce the collector-emitter voltage in the forward case without reducing the breakdown voltage of the components. That is why IGBTs have been developed with trench structures derived from DRAM technology. The difference from the planar IGBTs mentioned in the introduction lies in the fact that a V-shaped or U-shaped trench is introduced into the inner zone by anisotropic etching. The gate electrode is disposed in the trench in such a way that it is insulated from the inner zone. On one hand, that results in very low sheet resistances and high packing densities.

On the other hand, however, that nonplanar configuration is disadvantageous because it greatly deviates from the relatively simple planar technology.

SUMMARY OF THE INVENTION

It is accordingly an object of the invention to provide a field effect-controllable semiconductor component, which overcomes the hereinafore-mentioned disadvantages of the heretofore-known devices of this general type and which is developed by using planar technology in such a way that parameters of an IGBT with a trench structure are achieved without it being necessary to accept the demonstrated disadvantages.

With the foregoing and other objects in view there is provided, in accordance with the invention, a field effect-controllable semiconductor component, comprising a semiconductor body having an upper surface and a lower surface; an inner zone of a first conduction type adjoining the upper surface of the semiconductor body; an anode zone of a second conduction type adjoining the lower surface of the semiconductor body; a shielding zone of the first conduction type surrounded by the inner zone, the shielding zone having a higher doping concentration than the inner zone and having a lower edge; at least one base zone of the second conduction type embedded in the upper surface of the semiconductor body and embedded in the shielding zone; at least one non-connected, floating region of high conductivity of the second conduction type disposed in the vicinity of the inner zone, the floating region having a lower edge deeper in the inner zone than the lower edge of the shielding zone; at least one emitter zone of the first conduction type embedded in the base zone; an emitter electrode disposed above the upper surface of the semiconductor body and conductively connected to the emitter zone; a collector electrode disposed below the lower surface of the semiconductor body and conductively connected to the anode zone; and a gate electrode disposed above the upper surface of the semiconductor body and covering parts of the base zone and of the emitter zone, with an insulating clearance.

As a result of the incorporation of this shielding zone, an additional resistance is introduced in the inner zone shortly before the base zone and leads to an increase in the concentration of minority charge carriers in the inner zone. As a result, the voltage drop in the inner zone is distinctly reduced and, accordingly, there is a distinct reduction of the collector-emitter voltage ($V_{CESat}$) in the forward case at rated current. As a result, it is possible to minimize the steady-state power loss on one hand, and higher current densities can be achieved on the other hand, as a result of which smaller and thus more cost-effective semiconductor components can be used for the same overall current.

In order not to impair the blocking strength, the emitter regions surrounded by the shielding zones are shielded by the floating, non-connected regions.

In accordance with another feature of the invention, the IGBTs have a multiplicity of base zones, emitter zones and shielding zones which are disposed translationally periodically and are spatially separated by intercell zones. The emitter zones are connected in parallel in this case. These cell structures may be in strip form, hexagonal, triangular, round or quadrangular.

In accordance with a further feature of the invention, the floating region is disposed below the shielding zone and above the anode zone.

In accordance with an added feature of the invention, the floating region is embedded, spatially separated next to the shielding zone, in the upper surface of the semiconductor body, with the result that the floating regions are situated in the intercell zones in an IGBT having a cell-like structure.

The effect of the drift field produced due to the concentration gradient between the shielding zone and the base zone is that the inner zone no longer acts as a sink for the minority charge carriers, which effects a corresponding elevation of the minority charge carriers in the on state of the IGBT.

In accordance with a concomitant feature of the invention, the doping concentration is distinctly higher in the shielding zone than in the inner zone. Doping concentrations of $10^{17}/cm^3$ in the shielding zone and of $10^{14}/cm^3$ in the inner zone have proved to be particularly suitable since the shielding zone is thereby doped distinctly more highly than the inner zone and a sufficiently high concentration gradient between these two zones is thus produced. That concentration gradient effects a drift field so that the inner zone no longer acts as a sink for the minority charge carriers.

Other features which are considered as characteristic for the invention are set forth in the appended claims.

Although the invention is illustrated and described herein as embodied in a field effect-controllable semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, cross-sectional view through an IGBT according to the invention;

FIG. 2 is a fragmentary, cross-sectional view through an alternative IGBT according to the invention; and FIG. 3 is a fragmentary, cross-sectional view through a further alternative IGBT according to the invention.

DESCRIPTION OF THE PREFERRED EMBODIMENTS

Referring now in detail to the figures of the drawings as a whole, it is seen that FIGS. 1 to 3 demonstrate the invention by using an n-channel IGBT. The invention can, of course, also be transferred to p-channel IGBTs. A semiconductor body of the semiconductor component is designated by reference numeral 1 in FIGS. 1 to 3. The semiconductor body 1 has an upper surface 3 and a lower surface 4. The semiconductor body 1 has an n⁻-doped inner zone 2, which adjoins the upper surface 3 of the semiconductor body 1. A p-doped base zone 6 is embedded in the upper surface 3. Two n⁺-doped emitter zones 7 are embedded in the base zone 6. Emitter electrodes 8, which are composed of metal, for example aluminum, make contact with the base zones 6 and the emitter zones 7.

A p⁺-doped anode zone 5 adjoins the lower surface 4 of the inner zone 2. The anode zone 5 is connected to a collector electrode 9 through a metallization layer. Intercell zones 12 are situated next to the base zone 6 to the left and right thereof and spatially separate translationally periodically disposed base zones from one another.

A gate electrode 10 is disposed above the upper surface 3 and is insulated by a gate oxide 11. The gate electrode 10 may be composed of highly doped polysilicon or of metal.

In FIG. 1, the base zone 6 is embedded in a shielding zone 13, which is heavily n⁺-doped. The shielding zone 13 has a distinctly higher doping concentration than the inner zone 2 surrounding it. The shielding zone 13 has a left-hand lateral edge 17 and a right-hand lateral edge 18. A heavily p⁺-doped, non-connected, floating region 15 is situated next to each of these lateral edges and spatially separated therefrom. A lower edge 16 of these floating regions 15 lies deep in the inner zone 2. In particular, the lower edge 16 of the floating regions 15 is disposed deeper in the inner zone 2 than a lower edge 14 of the shielding zone 13.

FIG. 2 shows an alternative embodiment of the present invention, in which the floating region 15 is not disposed laterally next to the shielding zone 13 but rather is situated below the shielding zone 13 and above the anode zone 5. In this case the floating region 15 is disposed in such a way that it is spatially separated from the lower edge of the shielding zone 14, whereas FIG. 3 shows an embodiment in which the shielding zone 13 is embedded in the floating region 15.

In all three of the exemplary embodiments shown, the doping concentration is substantially higher in the shielding zone 13 than in the inner zone 2. In all three of the exemplary embodiments shown, the doping concentration in the shielding zone 13 has a value of approximately $10^{17}/cm^3$, whereas the doping concentration in the inner zone 2 has a value of approximately $10^{14}/cm^3$.

The way in which the structure according to the invention can be produced is described below with reference to FIG. 3. A p-type dopant, for example boron, is implanted into an n⁻-doped substrate. The dopant is then "driven in" or diffused through the use of a subsequent heat-treatment step. A heavily doped n-conducting region 13 is thereupon driven into the driven-in p⁺-doped layer, which serves as the floating region 15. This highly n-conducting region serves as the shielding zone 13. Once again a weakly n-conducting layer is then deposited epitaxially on that layer and upwardly terminates the semiconductor body. Then, on the upper surface 3 of this layer, the base zone 6 is embedded and highly n-conducting zones 13', 13" are implanted next to the base zone 6 through the use of a further implantation at the lateral edges of the base zone. These heavily n-doped zones 13', 13" are once again driven in, to be precise in such a way that they come into contact with the underlying highly n-type zone. Ultimately, these regions then form the surroundings of the base zone. The semiconductor body which is produced in this way is then processed further at the top, that is to say emitter zones, an emitter electrode, possible short-circuit regions as well as a gate electrode are formed.

The way in which the structures shown in FIGS. 1 to 3 function is explained in more detail below.

As a result of the shielding zone 13, an additional resistance for the minority charge carriers is incorporated in the inner zone 2. This additional resistance effects a large reduction of the collector-emitter voltage in the forward case at rated current, that is to say $V_{CESat}$ is greatly reduced. As a result, it is possible to minimize the steady-state power loss on one hand, and higher current densities can be achieved on the other hand. Therefore, smaller and thus more cost-effective semiconductor components can be provided for the same overall current.

The incorporation of this shielding zone 13 provides a structure which leads to considerable elevation of the minority charge carrier density at the cathode side of the IGBT, that is to say below the base zone 6. The effect of the drift field produced due to the concentration gradient between the shielding zone 13 and the inner zone 2 is that the base zone 6 no longer acts as a sink for the minority charge carriers, which results in a corresponding elevation of the minority charge carriers in the on-state of the IGBT. In order to ensure that the breakdown voltage of the IGBT is not reduced by the incorporation of the shielding zone 13, non-connected, floating regions 15 of the opposite conduction type are incorporated. Those regions are either disposed below the shielding zone 13 and above the anode zone 5 or lie next to the base zones 6 in the intercell zones 12. What is essential in this case is that the non-connected, floating regions 15 of the opposite conduction type have a penetration depth which is distinctly greater than the penetration depth of the shielding zone into the inner zone. The purpose of the non-connected, floating regions of the opposed conduction type with respect to the shielding zone 13 is to shield the regions directly at the cathode side, that is to say directly under the base zone 6, in other words to prevent the course of the equipotential lines from reaching as far as the lower edge of the base zones 6. This achieves a high blocking strength in addition to a very small $V_{CESat}$.

We claim:

1. A field effect-controllable semiconductor component, comprising:

a semiconductor body having:
  a) an upper surface and a lower surface;
  b) an inner zone of a first conduction type adjoining said upper surface of said semiconductor body;
  c) an anode zone of a second conduction type adjoining said lower surface of said semiconductor body;
  d) a shielding zone of the first conduction type surrounded by said inner zone, said shielding zone having a higher doping concentration than said inner zone and having a lower edge;
  e) at least one base zone of the second conduction type embedded in said upper surface of said semiconductor body and embedded in said shielding zone;
  f) at least one non-connected, floating region of high conductivity of the second conduction type disposed in the vicinity of said inner zone, said floating region having a lower edge deeper in said inner zone than said lower edge of said shielding zone; and
  g) at least one emitter zone of the first conduction type embedded in said base zone;

an emitter electrode disposed above said upper surface of said semiconductor body and conductively connected to said emitter zone;

a collector electrode disposed below said lower surface of said semiconductor body and conductively connected to said anode zone; and a gate electrode disposed above said upper surface of said semiconductor body and covering parts of said base zone and of said emitter zone, with an insulating clearance.

2. The field effect-controllable semiconductor component according to claim 1, including a multiplicity of other base zones, emitter zones and shielding zones disposed translationally periodically, and intercell zones in said semiconductor body spatially separating said base zones, emitter zones and shielding zones.

3. The field effect-controllable semiconductor component according to claim 1, wherein said floating region is disposed below said shielding zone and above said anode zone.

4. The field effect-controllable semiconductor component according to claim 1, wherein said floating region is embedded spatially separately next to said shielding zone in said upper surface of said semiconductor body.

5. The field effect-controllable semiconductor component according to claim 3, wherein said shielding zone has a doping concentration approximately three powers of ten greater than a doping concentration of said inner zone.

6. The field effect-controllable semiconductor component according to claim 4, wherein said shielding zone has a doping concentration approximately three powers of ten greater than a doping concentration of said inner zone.

* * * * *